United States Patent [19]
Peterson

[11] Patent Number: 4,511,995
[45] Date of Patent: Apr. 16, 1985

[54] DETECTOR-DUMMY DETECTOR COMBINATION WHICH IS INTEGRATED AS A SINGLE ELEMENT OF REDUCED SIZE

[75] Inventor: LuVerne R. Peterson, San Diego, Calif.

[73] Assignee: Burroughs Corporation, Detroit, Mich.

[21] Appl. No.: 508,944

[22] Filed: Jun. 29, 1983

[51] Int. Cl.³ .............................................. G11C 19/08
[52] U.S. Cl. ........................................................ 365/8
[58] Field of Search ....................................... 365/8, 43

[56] References Cited
U.S. PATENT DOCUMENTS
4,086,661  4/1978  Matsuyama et al. .................... 365/8

Primary Examiner—James W. Moffitt
Attorney, Agent, or Firm—Charles J. Fassbender; Kevin R. Peterson

[57] ABSTRACT

A magnetic bubble memory includes a planar magnetic film containing a plurality of magnetic bubbles which move in response to a magnetic field that rotates the film's plane; and further includes an improved mechanism for detecting the bubbles comprised of: a pair of elongated magnetoresistive members that lie over the film alongside of one another; the members having fingers that extend towards each other along the direction of elongation; the fingers of one member being interdigitated with the fingers of the other member such that they mesh together but do not touch; the fingers being interdigitated at angles of less than 180° so that magnetic poles which attract the bubbles are sequentially induced in the fingers of only one member, in the fingers of both members, and in the fingers of only the other member by each rotation of the field.

11 Claims, 10 Drawing Figures

FIG.3.
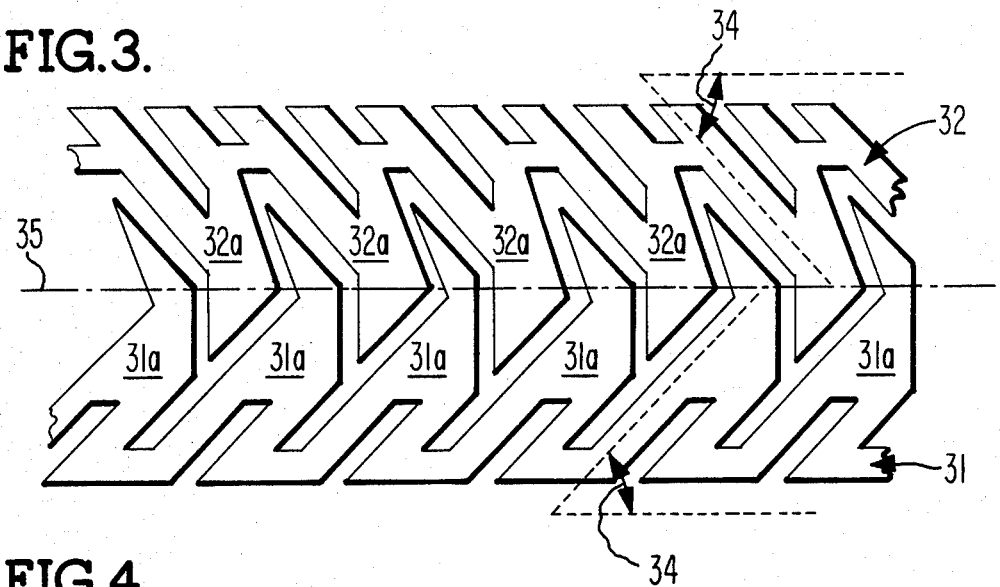
FIG.4.
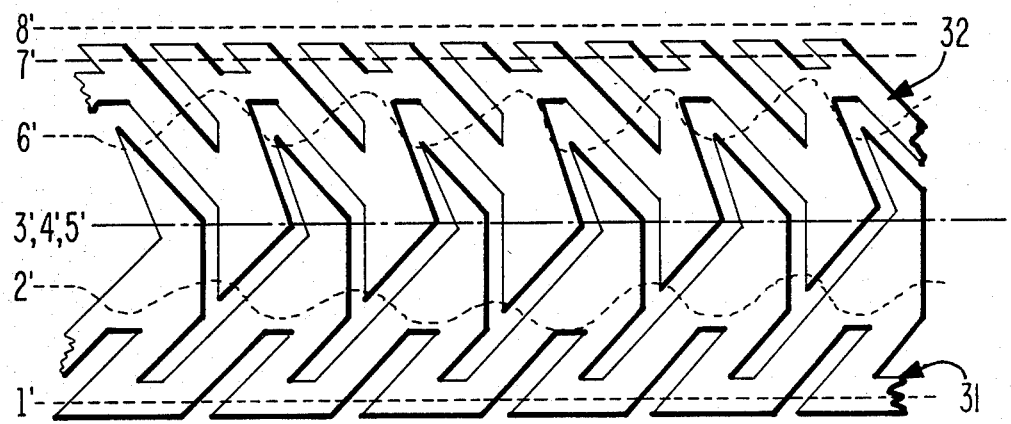
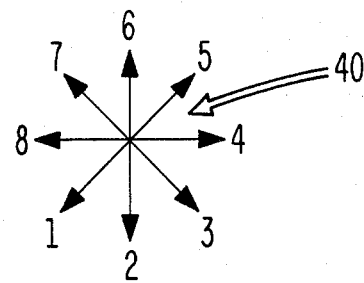

DETECTOR-DUMMY DETECTOR COMBINATION WHICH IS INTEGRATED AS A SINGLE ELEMENT OF REDUCED SIZE

BACKGROUND OF THE INVENTION

This invention relates to magnetic bubble memories; and more particularly it relates to mechanisms for detecting the presence of magnetic bubbles in such memories.

Some of the standard components of a bubble memory are a planar magnetic film in which the bubbles reside, an insulating layer over the film, a serial string of asymmetric chevrons on the insulating layer which define propagate paths along which the bubbles move, and a magnetic field which rotates in the plane of the film to cause the bubbles to move along the propagate paths. Also, a mechanism is disposed on the insulating layer for detecting the bubbles as they move along a portion of the bubble propagate path.

Reference numeral 20 of FIG. 1 indicates a prior art mechanism for detecting bubbles. Mechanism 20 has one part which is called a detector 21, and it has another part which is called a dummy detector 22. Detector 21 and dummy detector 22 both lie on an insulating layer 23 which in turn lies on a film which contains the bubbles.

Detector 21 includes approximately thirty rows of unconnected symmetric chevrons 21a. They are illustrated in the blown-up portion of FIG. 1; and they operate to stretch bubbles that are received from a bubble propagation path 24. Between two hundred and three hundred chevrons are included in each row.

Lying next to the chevron rows 21a is a single row of interconnected symmetric chevrons 21b. They are made of a magnet. Lying next to row 21b are approximately four rows of unconnected symmetric chevrons 21c. They operate to move the stretched bubbles away from row 21b and to annihilate the bubbles along the last row (i.e., the row that is furthest from row 21b).

Dummy detector 22 is separated from detector 21 by a space which approximately three rows of chevrons would occupy. This space is provided so that detector 21 and dummy detector 22 do not electromagnetically interact.

Dummy detector 22 includes approximately 10 rows of unconnected symmetric chevrons 22a. These chevrons 22a do not receive any bubbles from a bubble propagate path such as path 24.

Lying next to the chevron rows 22a is a single row of interconnected symmetric chevrons 22b. This row is made of a magnetoresistive material; and since the chevrons 22a never receive any bubbles, the resistance of the chevrons 22b operates as a reference which indicates the absence of a bubble. Conductive leads 22' connect to row 22b so that its resistance can be detected external to the chip.

Lying next to row 22b are approximately four rows of chevrons 22c. Their function, along with chevrons 22a, is to make the physical structure of dummy detector 22b similar to the structure of detector 21 so that, ideally, the resistance of the rows 21b and 22b will be the same when no bubble is being sensed by detector 21.

One problem, however, with the above-described prior art mechanism 20 is that it occupies too much space. Typically, the area occupied by the dummy detector 22 is at 3 least width of chip X 10 mils. That area could be used to store bubbles and thereby increase the memory's storage capacity if it were not needed for the dummy detector.

Another problem with mechanism 20 is that the resistance of the interconnected chevron rows 21b and 22b is sensitive to the pattern of the bubbles being detected. In other words, the resistance in chevron row 21b is not determined solely by the presence or absence of a bubble under that row; but instead, it is also determined by the presence or absence of a bubble in the rows which lie alongside of row 21b. Thus, if no bubble is beneath row 21b while bubbles are beneath all of the other rows 21a and 21c, the resistance of row 21b will be substantially different than the resistance of row 22b.

Still another problem with the mechanism 20 is that the resistance of chevron rows 21b and 22b is affected differently by the magnetic field which rotates in the plane of the film. This is because rows 21b and 22b lie apart from one another, and because the strength of a rotating field is stronger at the center of a chip than at its periphery. And since the chevron rows 21b and 22b are made of a magnetoresistive material, the resistance of those elements is determined not only by the presence or absence of a bubble; but it is also determined by the strength of the rotating magnetic field.

BRIEF SUMMARY OF THE INVENTION

In view of the above, one object of the invention is to provide an improved mechanism for detecting bubbles in a magnetic bubble memory.

Another object of the invention is to provide an mechanism for detecting magnetic bubbles which occupies a reduced amount of space, has a reduced sensitivity to the pattern of the bubbles that are being detected, and has a reduced sensitivity to strength variations in the rotating magnetic field which propagates the bubbles.

These objects and others are accomplished in accordance with the invention by a mechanism for detecting magnetic bubbles which move in response to a rotating magnetic field that is comprised of a pair of elongated magnetorestrictive members which lie alongside of one another; the members having fingers that extend towards each other along the direction of elongation to mesh with but not touch each other; the fingers being shaped such that each rotation of the field sequentially induces attractive magnetic poles in the fingers of only one member, in the fingers of both members, and in the fingers of only the other member; so that a relatively large differential resistance between the members when the poles are in only a single member indicates the presence of a bubble and a relatively small resistance indicates the absence of a bubble.

In one preferred embodiment, the fingers are slanted with respect to the direction of elongation by an angle of 45°±30°; the members zigzag along the direction of elongation such that each finger is made up of a series of turns along the zigzag shape; and the fingers curve in opposite directions about a central axis between the members so that small attractive poles are induced in the curved portion of one member when large attractive poles are induced in the uncurved portion of the other member.

BRIEF DESCRIPTION OF THE DRAWINGS

Various features and advantages of the invention are described in the Detailed Description in conjunction with the accompanying drawings wherein:

FIG. 3 illustrates an enlarged view of two of the components 31 and 32 in the embodiment of FIG. 2;

FIG. 4 illustrates the sequence by which magnetic bubbles move beneath components 31 and 32 of FIG. 3.

DETAILED DESCRIPTION OF THE INVENTION

Figure 1:
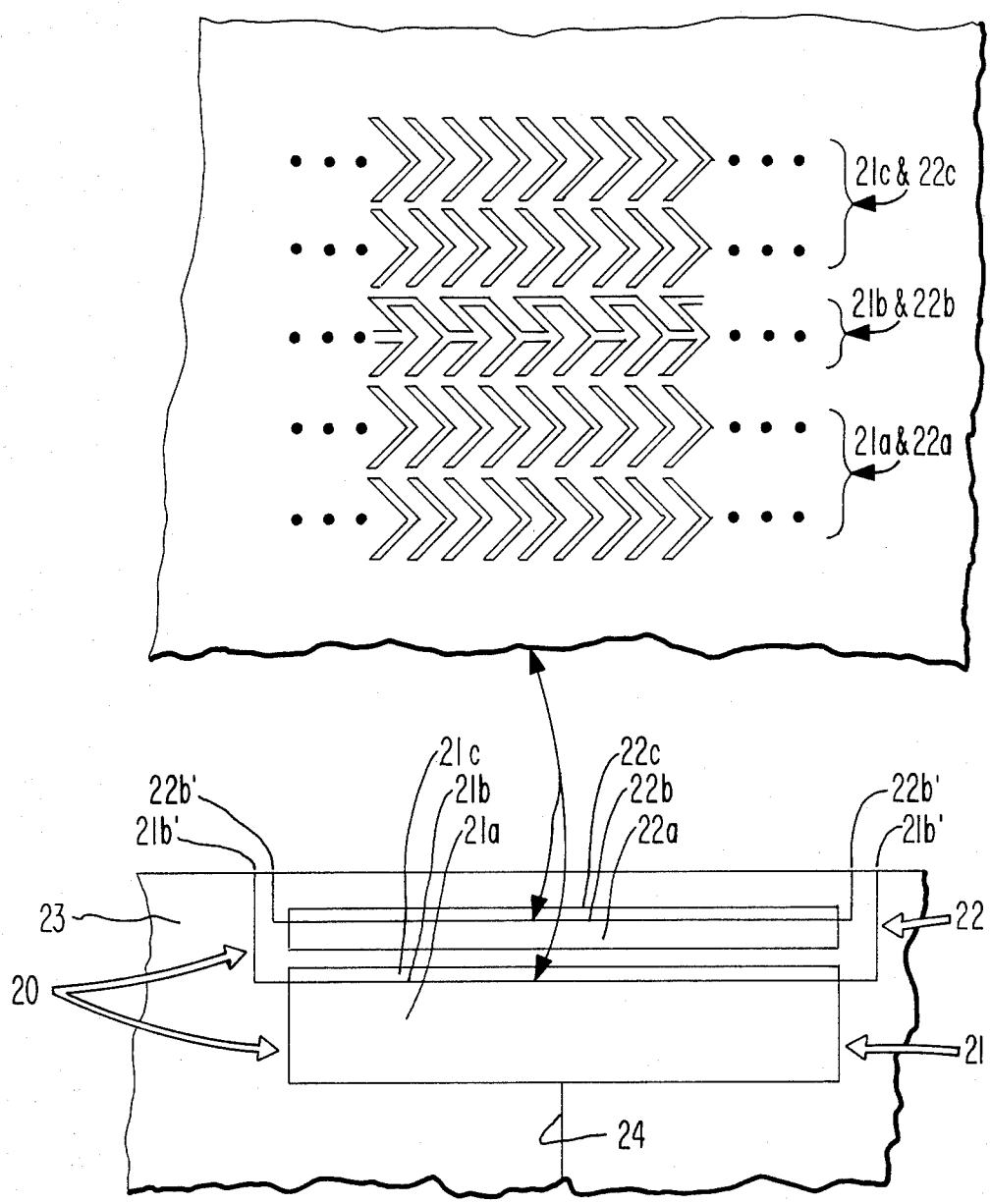
FIG. 1 illustrates a mechanism for detecting magnetic bubbles in accordance with the prior art.
Figure 2:
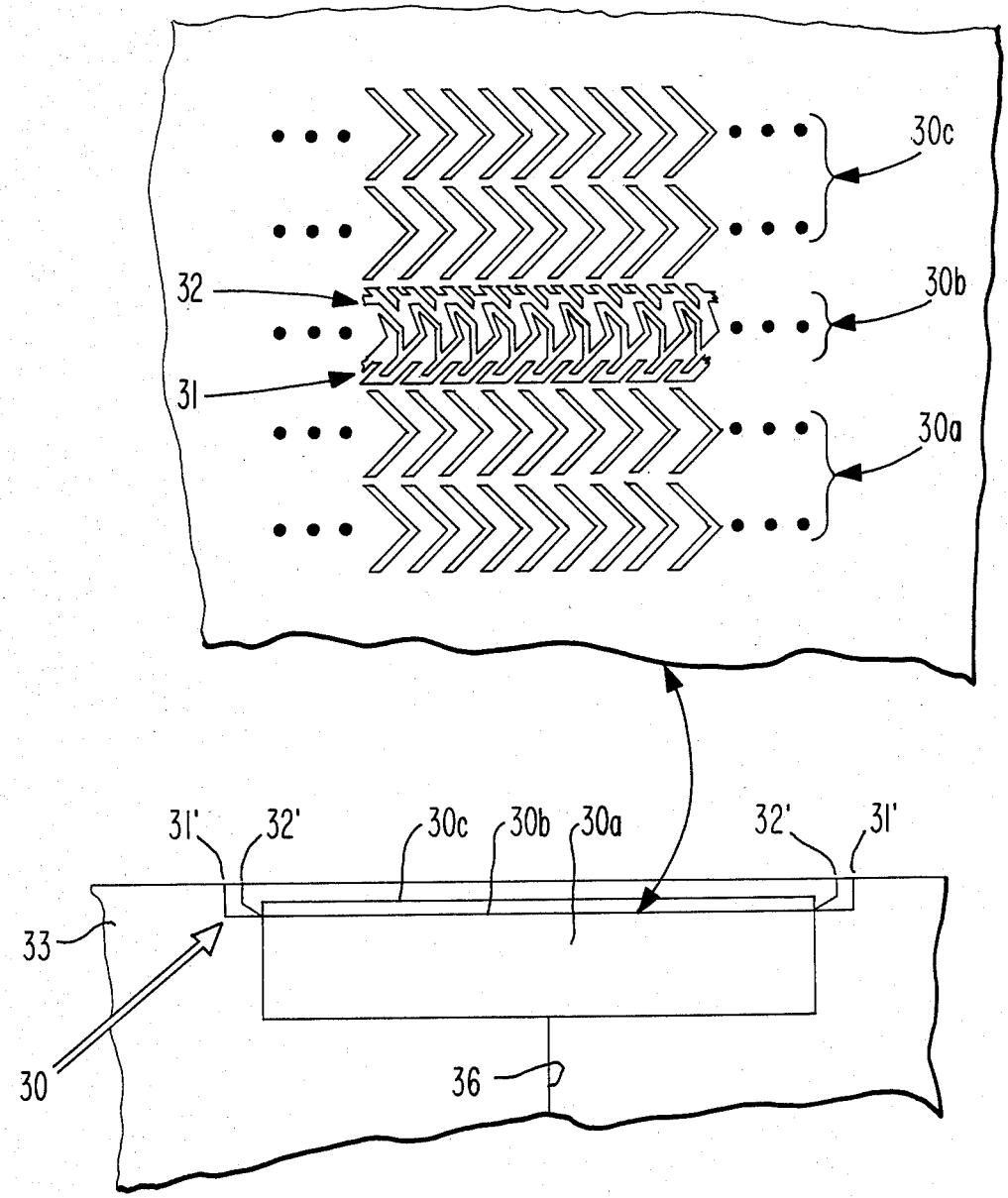
FIG. 2 illustrates a mechanism for detecting magnetic bubbles in accordance with the invention.

One preferred embodiment 30 of the invention will now be described in detail beginning with FIG. 2. Embodiment 30 includes several rows of unconnected symmetric chevrons 30a, a pair 30b of elongated magnetoresistive members 31 and 32, and several other rows of unconnected symmetric chevrons 30c. Components 30a, 30b, and 30c lie on an insulating layer 33 which in turn lies on the magnetic film which contains the bubbles that are to be detected.

Members 31 and 32 are the key novel components in embodiment 30; and FIG. 3 illustrates their physical structure in greater detail. As there illustrated, the members 31 and 32 have respective fingers 31a and 32a that extend towards each other along the direction of elongation. Also, the fingers 31a are interdigitated with the fingers 32a such that they mesh together but do not touch. Further, the fingers 31a and 32a are slanted with respect to the direction of elongation by an angle 34 of about 45°.

Also in the embodiment 30, the members 31 and 32 zigzag along the direction of elongation such that each of the fingers 31a and 32a is made up of a series of turns along the zigzag path. Further, the tips of the interdigitated fingers curve in opposite directions about a central axis 35 which runs between the members so that the curved portions of one member are almost parallel to the uncurved portions of the other member.

In operation, magnetic bubbles which are to be detected are moved along a serial string of asymmetric chevrons 36 in response to a magnetic field that rotates in the plane of the film. Thereafter, the chevron rows 30a operate to stretch the bubbles that are received from path 36. Thus the number of chevron rows 30a should be sufficient to stretch the bubbles to a suitable length (e.g., thirty).

Next, the stretched bubbles move beneath the elongated members 31 and 32. Specifically, during each rotation of the rotating field, the bubble first moves under just member 31; then it moves under the fingers of both of the members 31 and 32; and then it moves under just element 32. In the latter position the resistance of member 31 serves as a reference to indicate the absence of a bubble while the resistance of member 32 is compared against the resistance of member 31 to indicate the presence or absence of a bubble.

Thereafter, the stretched bubbles move away from members 31 and 32 through the chevron rows 30c whereupon they are annihilated. Four rows of chevrons suitably achieve this function.

From the above it is apparent that element 31 together with the chevron rows 30a and 30c operate as a dummy detector; while member 32 together with the chevron rows 30a and 30c operate as a detector. Thus embodiment 30 occupies a substantially reduced amount of space since separate rows of unconnected chevrons are not required for the detector and the dummy detector.

Embodiment 30 also has a reduced sensitivity to the pattern of the bubbles which are being detected since both member 31 and member 32 are exposed to the same identical pattern. If, for example, respective bubbles lie under all of the chevron rows 30a and 30c while no bubble lies under the members 31 and 32, then the degree by which the bubbles under the chevron rows 30a and 30c affect the resistance of the members 31 and 32 will be about the same.

Embodiment 30 further has a reduced sensitivity to variations in the strength of the rotating magnetic field since members 31 and 32 are very close to one another. Thus, any variations in the strength of that field will affect the resistance of the members 31 and 32 by essentially the same amount.

A detailed picture of the sequence by which bubbles move beneath the elongated elements 31 and 32 in response to a rotating magnetic field 40 is illustrated in FIG. 4. There, reference numerals 1 through 8 indicate various directions of the field; and reference numerals 1' through 8' indicate the position of the bubbles beneath members 31 and 32 which correspond to those field directions. That is, the bubble lies at position 1' when the field points in direction 1; the bubble lies at position 2 when the field points in direction 2; etc.

Inspection of FIG. 4 shows that when the field points in direction 1, the bubble underlies only member 31; when the field points in positions 2 through 6, the bubble underlies both of the members 31 and 32; and when the field points in direction 7, the bubble underlies only element 32.

Consequently, when the field is in position 7, the resistance of member 32 will indicate the presence or absence of a bubble while the resistance of member 31 will always indicate the absence of a bubble. Thus, when the field is in position 7, the resistance of members 31 and 32 can be compared to determine whether or not a bubble is present under member 32.

Conversely, when the field points in direction 1, the resistance of member 31 will indicate the presence or absence of a bubble while the resistance of member 32 will always indicate the absence of a bubble. Thus, as an alternative, when the field points in direction 1, the respective resistances of members 31 and 32 can be compared to determine whether or not a bubble underlies element 31.

Why the bubbles sequentially move along by the above-described positions 1' through 8' can be understood by inspection of FIGS. 5A–5F. Those figures show how for each rotation of the magnetic field 40, magnetic poles which attract the bubbles are sequentially induced in the fingers of only member 31, in the fingers of both of the members 31 and 32, and in the fingers of only the other member 32.

Figure 5A:
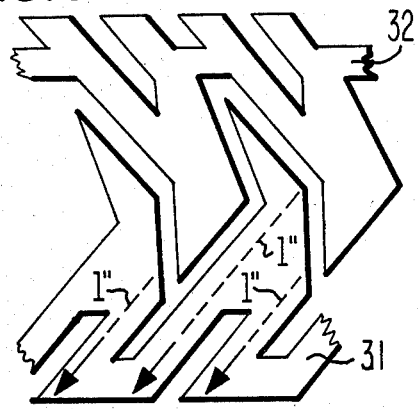
FIGS. 5A–5F illustrate the sequence by which magnetic poles are induced in the components 31 and 32 by a rotating magnetic field to thereby cause the bubbles to move according to the sequence of FIG. 4.

Referring first to FIG. 5A, it can be seen that when the field 40 points in direction 1, that field is parallel to the uncurved portion of the fingers of member 31. Consequently, magnetic poles are induced in those fingers as indicated by the reference numeral 1''.

Figure 5B:
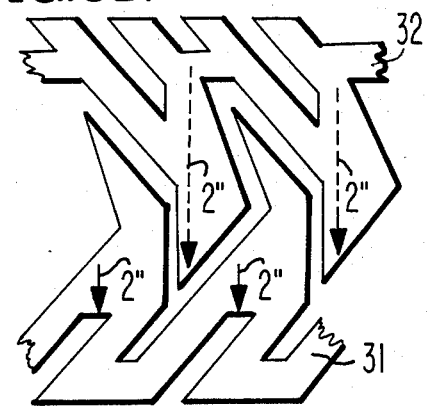

Next, FIG. 5B shows that when the field 40 points in direction 2, that field is parallel to the tips of the fingers of member 32 which curve about the central axis. Thus, the finger tips of member 32 are magnetized with magnetic poles that attract the bubbles as indicated by the reference numeral 2''. At the same time, smaller magnetic poles which attract the bubbles are also induced in the fingertip portions of member 31 as is also indicated by reference numeral 2''.

Figure 5C:
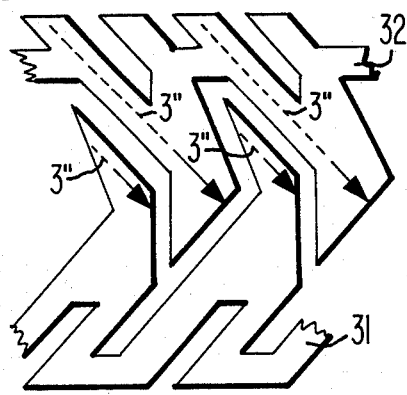

Next, referring to FIG. 5C, it is seen that when the field 40 points in direction 3, the field is parallel to the uncurved portion of the fingers of member 32. Thus, magnetic poles which attract the bubbles are induced in those fingers as indicated by reference numeral 3''. At the same time, the tips of the fingers of member 31 are also parallel to the magnetic field; and so small magnetic poles 3'' which attract the bubbles are also induced in those tips. These poles are small since the physical size of the tips of the fingers 31a is small.

When the field points in direction 4, that field is at an acute angle with respect to the uncurved portion of the fingers of both members 31 and 32. Consequently, relatively small attractive poles are induced in the fingers of both of those members; and these poles are superimposed on one another along the central axis 35. This case is not specifically illustrated since it can easily be visualized.

Figure 5D:
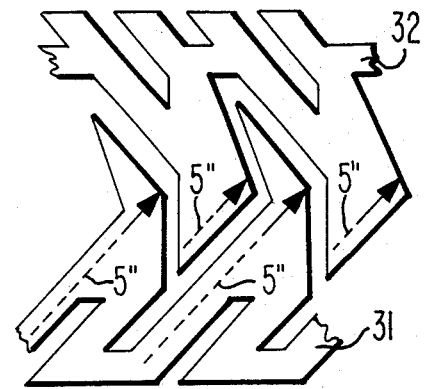

Next, FIG. 5D shows that when the field 40 points in direction 5, the field is parallel to the uncurved portion of the fingers of member 31. So, relatively large attractive poles are induced in those fingers as indicated by reference numeral 5''. At the same time, the field is parallel to the curved portion of the fingers of member 32; and so relatively small attractive poles are induced in those fingertips. This case is just the opposite of the case that is illustrated in FIG. 5C.

Figure 5E:
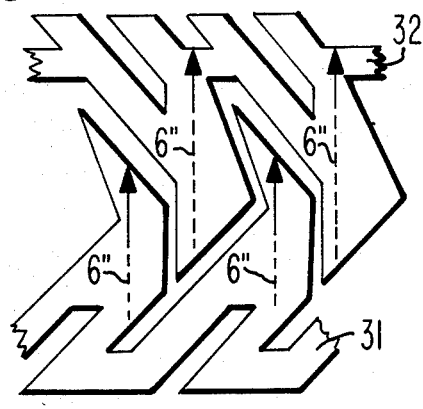
Figure 5F:
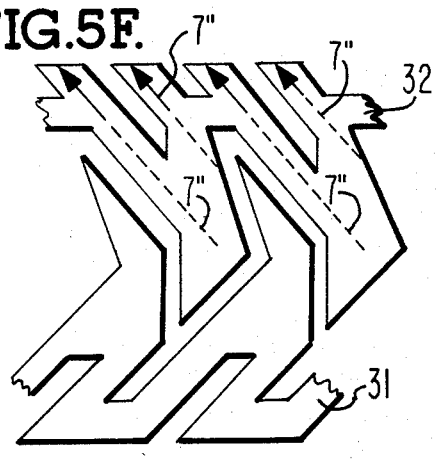

Next, FIG. 5E shows that when the field 40 is in position 6, that field is parallel to the curved portion of the fingers of member 32. Thus magnetic poles 6'' are induced in those curved finger portions as indicated. Also when the field is in position 6, it is parallel to a small portion of the curved fingertips of member 31; so small magnetic poles are induced therein as reference numerals 6'' also indicates.

Finally, when the field 40 points in direction 7, that field is parallel to the uncurved portion of the fingers of member 32. Thus, magnetic poles are induced in those uncurved finger portions as indicated by reference numeral 7''.

In summary, FIGS. 5A-5F show the magnetic poles 1'' through 7'' that are induced in the elongated members 31 and 32 for each rotation of the magnetic field 40. And a comparison of the position of those poles 1'' through 8'' shows that they correspond to the positions 1' through 8' of the bubbles that were previously described in conjunction with FIG. 4.

A preferred embodiment of the invention has now been described in detail. In addition, however, many changes and modifications can be made to these details without departing from the nature and spirit of the invention. Accordingly, the invention is not to be limited to said details but is defined by the appended claims.

What is claimed is:

1. A magnetic bubble memory of the type that includes a planar magnetic film containing a plurality of magnetic bubbles which move in response to a magnetic field that rotates in said plane; wherein said memory further includes an improved detector-dummy detector mechanism for detecting said bubbles comprised of:
an elongated magnetoresistive detector member and an elongated magnetoresistive dummy detector member that lie alongside of one another on a single insulating layer at the same uniform height over said magnetic film;
said detector and said dummy detector members having fingers that extend towards each other along the direction of elongation;
said fingers of said detector member being interdigitated with the fingers of said dummy detector member such that they mesh together but do not touch;
said fingers of said detector and dummy detector members being interdigitated at angles of less than 180° and such that, at one point during each rotation of said field, magnetic poles which attract said bubbles are induced in the fingers of only said detector member to thereby make any difference in resistance between the two members indicate the presence of a bubble.

2. The memory of claim 1 wherein said members zigzag along the direction of elongation with each finger being made up of a series of turns along the zigzag shape.

3. The memory of claim 2 wherein said interdigitated fingers curve in opposite directions about an axis which runs between said members so that small attractive poles are induced in the curved portion of one member when large attractive poles are induced in the uncurved portion of the other member.

4. The memory of claim 3 and further including a means for sensing any difference in resistance between said members when said magnetic poles which attract said bubbles are induced in the fingers of only one of said members.

5. The memory of claim 4 wherein at least one hundred of said fingers are included on each member, and the length of each member is at least one hundred times the width.

6. A detector-dummy detector mechanism for detecting magnetic bubbles which move in response to a rotating magnetic field comprised of: an elongated magnetoresistive detector member and an elongated magnetoresistive dummy detector member that lie alongside of one another on a single insulating layer; said members having fingers that extend towards each other along the direction of elongation to mesh with but not touch each other; said fingers being shaped such that at one point during each rotation of said field magnetic poles which attract said bubbles are induced in the fingers of only said detector member and not said dummy detector member so that a relatively large differential resistance between said members when said poles are in only said detector member indicates the presence of a bubble and a relatively small resistance indicates the absence of a bubble.

7. The mechanism of claim 6 wherein said fingers mesh together at angles of less than 180°.

8. The mechanism of claim 6 wherein said members zigzag along the direction of elongation with each finger being made up of a series of turns along the zigzag shape.

9. The mechanism of claim 6 wherein said fingers curve in opposite directions about an axis which runs between said members so that small attractive poles are induced in the curved portion of one member when large attractive poles are induced in the uncurved portion of the other member.

10. The mechanism of claim 6 and further including a means for sensing any difference in resistance between said members when said magnetic poles which attract said bubbles are induced in the fingers of only one of said members.

11. The mechanism of claim 6 wherein at least one hundred of said fingers are included on each member, and the length of each member is at least one hundred times the width.

* * * * *